United States Patent [19]

Hingorany

[11] Patent Number: 4,673,967
[45] Date of Patent: Jun. 16, 1987

[54] SURFACE MOUNTED SYSTEM FOR LEADED SEMICONDUCTOR DEVICES

[75] Inventor: Premkumar Hingorany, Foxboro, Mass.

[73] Assignee: Texas Instruments Incorporated, Dallas, Tex.

[21] Appl. No.: 696,125

[22] Filed: Jan. 29, 1985

[51] Int. Cl.$^4$ ............................................. H01L 23/48
[52] U.S. Cl. .......................................... 357/70; 357/71; 361/403; 361/405; 174/52 FP; 29/827; 29/840
[58] Field of Search ................. 357/70, 71; 361/403, 361/405; 174/53 FP; 29/827, 840

[56] References Cited

U.S. PATENT DOCUMENTS

| | | | |
|---|---|---|---|
| 3,942,245 | 3/1976 | Jackson et al. | 357/70 |
| 4,141,029 | 2/1979 | Dromsky | 357/70 |
| 4,147,889 | 4/1979 | Andrews et al. | 357/70 |

Primary Examiner—Edward J. Wojciechowicz
Attorney, Agent, or Firm—James P. McAndrews; John A. Haug; Melvin Sharp

[57] ABSTRACT

An improved surface mounted system for leaded semiconductor devices has J-shaped device leads soldered to respective portions of circuit pads on a printed circuit board, each lead having inner and outer surfaces of the J-shape covered with solder dewetting and solder wetting metals respectively which are metallurgically bonded to a metal core of the lead formed of a springy, relatively high electrical conductivity metal. The short leg of each J-shaped lead is curved and the outer, solder wettable surface of that curved lead part is soldered to a selected circuit pad portion, preferably by use of a pad or solder paste deposited on the circuit pad portion, while other surfaces of the lead are maintained substantially free of solder for avoiding solder bridging between leads and for assuring that an adequate amount of solder is retained between the curved lead part and the desired circuit pad portion to provide secure electrical connection to the printed circuit and secure surface mounting of the device on the circuit board.

7 Claims, 3 Drawing Figures

SURFACE MOUNTED SYSTEM FOR LEADED SEMICONDUCTOR DEVICES

BACKGROUND OF THE INVENTION

Semiconductor devices such as plastic leaded chip carriers (PLCC) and small outline integrated circuits (SOIC) are presently being utilized in printed circuit board systems where the devices are surface mounted on the circuit boards by soldering J-shaped device leads to respective portions of the printed circuit on the board. The device leads are spaced from each other in rows extending along edges of the device with the longer legs of the J-shape depending down from the main body of the semiconductor device and with the shorter legs of the J-shape preferably extending inwardly under the device body to be accommodated between the device and the printed circuit board. The shorter legs of the leads are curved to provide a convex arc-shaped outer surface and those arc-shaped lead surfaces are soldered to respective portions of the printed circuits for electrically connecting the leads in the circuit and for surface mounting the device on the board. In some of the devices, bumper pads of plastic or other electrically insulating material on the semiconductor device body engage inner surfaces of the shorter curved legs of the J-shaped leads for providing more secure mounting of the device on the printed circuit board. During use of wave, vapor phase or other conventional soldering techniques in mounting the devices on the board, it is found that sometimes an excessive amount of solder is wicked or drawn up on the inner surfaces of the J-shaped leads to cause solder bridging between device leads and it is frequently found that, particularly where vapor phase soldering or the like is used, the quantity of solder provided on the outer surfaces of the curved shorter lead legs is excessively depleted by solder being wicked or drawn up on the inner surfaces of the leads so that there is poor electrical connection of the device to the printed circuit or poor mechanical mounting of the devices on the board.

SUMMARY OF THE INVENTION

It is an object of this invention to provide a novel and improved semiconductor device particularly adapted for improved surface mounting on printed circuit boards; to provide a novel and improved surface mounted system for leaded semiconductor devices; and to provide novel and improved methods for surface mounting leaded semiconductor devices on printed circuit boards.

Briefly described, the novel and improved semiconductor device of this invention comprises a semiconductor element such as an integrated circuit or the like mounted on a device body of an electrical insulating material. Preferably a plurality of J-shaped leads are electrically connected to the semiconductor element and extend from the device body in spaced rows. Each lead has a J-shape with a first leg depending from the semiconductor device along one device side and having a second leg extending from the distal end of the first leg inwardly beneath the device body, the second leg being curved to have an arc-shaped convex outer surface. In accordance with this invention, the device leads each embody a composite metal laminate material having a base metal layer portion of the lead embodying a copper-based alloy or the like characterized by springy resilience and by relatively high electrical conductivity and having a layer of metal of relatively low solder wettable characteristics metallurgically bonded to the base layer portion disposed on the inner surface of the J-shaped lead. Preferably the J-shaped leads each comprise a core layer of a springy, high electrical conductivity metal such as CDA Alloy 155 having a layer of an aluminum bronze alloy or the like such as CDA Alloy 613 or CDA Alloy 614 metallurgically bonded to the core layer on the inner surface of the J-shaped lead. Preferably at least the outer curved portion of the second lead leg also has an additional metal layer of a metal material characterized by relatively high solder wetting characteristics metallurgically bonded to the core layer of the material. The additional metal layer material is preferably selected to have high corrosion resistance characteristics and can desirably comprise commercially pure nickel.

In the novel and improved surface mounted method and system of this invention, the noted curved outer surface portions of the semiconductor device leads are soldered to respective portions of a printed circuit provided on a conventional printed circuit board substrate for electrically connecting the leads to desired portions of the circuit and for securely mounting the semiconductor device on the surface of the printed circuit board. In accordance with this invention, the solder used in securing the leads to the respective printed circuit portions is retained between the respective printed circuit portions and the curved outer surfaces of the second legs of the J-shaped device leads to securely mount the device on the printed circuit board without risk of undesired solder bridging between the device leads while assuring that sufficient solder is retained between the leads and the printed circuit portions to provide secured device mounting. Preferably melted solder is disposed between the curved lead surfaces and the desired printed circuit portions, as by having solder paste or the like deposited on the lead or on the respective printed circuit portions, while the curved outer surfaces of the J-shaped leads are positioned against the desired printed circuit portions, whereby the curved surfaces of each lead cooperate with the high solder wetting metal characteristics of the material provided on the outer surfaces of the leads and with the relatively lower solder wetting characteristics of the other lead surfaces to retain the solder in the desired location between the curved outer lead surfaces and the printed circuit portions to enhance electrical connection and mounting of the device to the printed circuit without risk of excessive solder depletion from the desired solder areas by wicking of solder away from those areas.

DESCRIPTION OF THE DRAWINGS

Other objects, advantages and details of the noval and improved semiconductor device, system and method of this invention appear in the following detailed description of preferred embodiments of the invention, the detailed description referring to the drawings in which.

DESCRIPTION OF THE PREFERRED EMBODIMENTS

Figure 1:
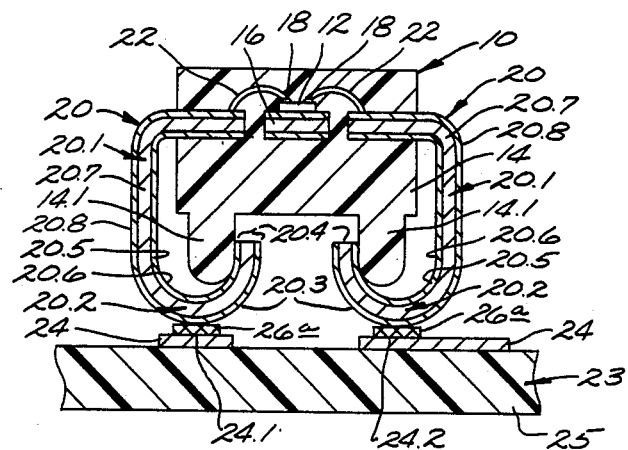
FIG. 1 is a section view to enlarged scale along a central axis of an integrated circuit semiconductor device illustrating the device positioned according to a step in the method of this invention to be mounted in a surface mounted system in accordance with the invention.

Briefly described, the novel and improved semiconductor device 10 of this invention is shown in FIG. 1 to comprise a semiconductor element such as an integrated circuit chip 12 which is mounted in any conventional manner within a semiconductor device body 14 formed of a plastic, ceramic or other electrically insulating material or the like on a portion 16 of a lead frame or the like and having terminals 18 of the integrated circuit chip electrically connected to device leads 20 by bonded lead wires 22 or the like in any conventional manner. The leads 20 extend from the device body, usually along at least two opposite sides of the body or the like and each preferably has a J-shape comprising a first, usually longer leg 20.1 depending down from the device body and a second relatively shorter leg 20.2 which typically extends from the distal end of the first leg under the device body as shown in FIG. 1. The shorter lead leg has a curved configuration so that the outer surface 20.3 of the second leg has a curved convex configuration as viewed in FIG. 1. Typically, the groups of the leads 20 are arranged in spaced electrically insulated relation to each other in at least a pair of rows which extend along sides of the device body as will be understood, only one lead from each of two such rows being illustrated in FIG. 1 for simplicity of illustration. If desired, bumpers 14.1 provided on the device body abut the curved inner surfaces of the J-shaped leads to assist in positioning the leads in the desired location on the body during device handling. As the structure of the device 10 as thus far described is completely conventional, it is not further described herein and it will be understood that various types of plastic leaded chip carrier devices (PLCC) or small outline integrated circuit devices (SOIC) and the like are contemplated at being within the scope of this invention.

Figure 2:
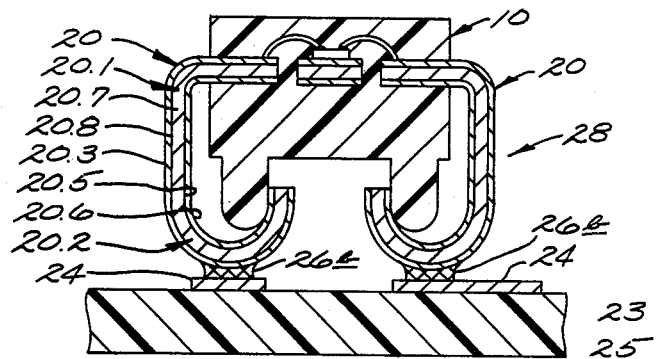
FIG. 2 is a section view similar to FIG. 1 illustrating a subsequent step in the method of FIG. 1 for completing the system of this invention.

In accordance with this invention, the leads 20 are each formed of a composite metal laminate material having a first base metal layer portion 20.4 of the lead which preferably embodies a metal material selected to display a desired springy resilience and desired, relatively high electrical conductivity. The lead also comprises a second layer 20.5 of another different metal layer material which is metallurgically bonded to the base metal layer portion of the lead so the second metal layer is disposed on the inner surface 20.6 of the J-shaped lead as shown in FIG. 2, the second metal layer material being selected to display relatively lower solder wetting characteristics than the base metal layer portion of the lead.

Preferably for example the base metal layer portion 20.4 of the lead comprises a core layer 20.7 formed of a springy, relatively high electrical conductivity material such as the copper based alloy called CDA alloy 155 having a nominal composition by weight of 99.75% minimum copper (including silver), 0.04% to 0.08% phosphorus, and 0.1% to 0.12% magnesium. However other springy conductive metal materials are also adapted to be used in the core layer of the leads 20 within the scope of this invention. Preferably the base metal layer portion 20.4 of the lead also comprises an additional metal layer 20.8 of a material such as commercially pure nickel or the like characterized by relatively high solder wettability and preferably by relatively high corrosion resistance properties, that additional metal layer being metallurgically bonded to the core layer material to be disposed on the outer surface 20.3 of the lead and particularly to extend over the curved outer surface of the shorter leg of the J-shaped lead. Preferably the low solder wetting layer material 20.5 is formed of an aluminum bronze material or the like such as an alloy selected from the group consisting of CDA Alloy 613 and CDA Alloy 614. Such alloys have respective nominal compositions by weight of 92.7% copper, 0.2% to 0.5% tin, 6% to 8% aluminum, 0.5% (max.) manganese, and 0.5% (max.) nickel and of 91% copper, 1.5% to 3.5% iron, 0.2% (max.) zinc, 6% to 8% aluminum, 1% (max.) manganese, and 0.015% (max.) phosphorus. Preferably the selected low solder wetting materials utilized in the metal layer 20.5 are characterized by good corrosion resistance properties as are the preferred aluminum bronze materials noted above.

In accordance with the method of this invention, the semiconductor device 10 as above described is disposed adjacent a conventional printed circuit board 23 having a printed circuit 24 formed on an electrically insulating substrate 25 so that the curved outer surfaces 20.3 of the shorter lead legs on the device 10 are disposed adjacent selected portions 24.1, 24.2 of the printed circuit and solder material 26 is arranged at each of those printed circuit locations for soldering the curved surfaces of the leads to the printed circuit. Any conventional solder material such as a solder having a nominal composition by weight of 60% tin and 40% lead is used within the scope of this invention. Preferably for example, pads 26a of a conventional solder paste or the like are disposed on the respective portions of the printed circuit 24 and the outer curved surfaces of the shorter legs of the J-shaped leads of the device 10 are rested against those pads as shown in FIG. 1 in one step of the method of this invention. The solder pads are then melted in any conventional manner so that, as illustrated in FIG. 2, the solder material disposed in each pad is drawn up against the adjacent curved outer surface of the short leg of the J-shaped lead to be retained between that curved outer surface of the lead and the corresponding printed circuit portion as indicated at 26b in FIG. 2 for providing secure electrical connection of the lead to the printed circuit 24 and for securely mounting the device 10 at the surface of the printed circuit board 23 for forming the surface mounted system 28 of this invention. It is believed that the curved outer surface of the lead leg cooperates with the relatively high solder wettability of the metal layer material provided on the outer curve surface of the leads and with the relatively lower solder wettability of the other components of the leads, particularly the metal layer on the inner surface of the J-shaped lead, to retain substantially all of the solder from the pad 26a in that desired solder connection location. In that arrangement, the solder 26 does not tend to be drawn up on the inner surface of the device leads, or between the inner surfaces and the body bumpers 14.1, such as might risk solder bridging between the illustrated leads of the device 10 and adjacent leads (not shown) in rows of leads extending along the device side or such as might excessively deplete the amount of solder provided by the pad 26a so as to form a poor electrical connection to the printed circuit or to provide insecure mounting of the semiconductor device in the system 28.

Figure 3:
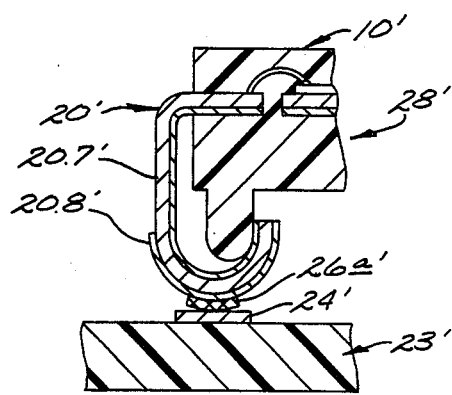
FIG. 3 is a partial section view similar to FIG. 2 illustrating an alternate embodiment of the device, method and system of the invention.

In an alternate embodiment of the invention as illustrated in FIG. 3, wherein corresponding reference numerals refer to corresponding components, the metal layers 20.8' on the outer surfaces of the J-shaped device leads are limited to the curved portions on the outer lead surfaces of the shorter lead legs for further limiting solder wetting of the outer lead surfaces on the shorter lead legs, thereby to further assist in retaining the solder 26' in the desired solder location between the curved outer leg surface and the printed circuit. The solder pad 26a' is also provided on the curved outer lead surface as shown in FIG. 3 if desired within the scope of this invention. As will be understood, melting of the solder pads 26a' provides a comparable surface mounted system 28' corresponding to the system described with reference to FIGS. 1 and 2.

It should be understood that although particular embodiments of the invention are described for the purpose of illustrating the invention, the invention includes all modifications and equivalents of the disclosed embodiments falling within the scope of the appended claims.

I claim:

1. A semiconductor device having a semiconductor element mounted on an electrically insulating body and having at least one J-shaped lead electrically connected to the element and extending from the body so that a first lead leg depends from the body and a second lead leg extends from the distal end of the first leg, the second leg having a curved configuration with a convexly curved outer leg surface, characterized in that the second leg has a curved inner surface and the lead comprises a composite metal laminate material having a base metal layer portion embodying a springy metal material of selected electrical conductivity and solder wettability having a layer of metal of relatively lower solder wettability metallurgically bonded to the base metal layer portion disposed on the curved inner surface of the second J-shaped lead leg to avoid drawing up of solder onto the curved inner surface of the second lead leg during soldering of the lead so that the curved outer leg surface of the second lead leg is adapted to be securely soldered to a selected portion of a printed circuit for making an electrical connection to the circuit while tending to retain solder used in such connection between the curved outer surface of the second lead leg and the selected printed circuit portion.

2. A semiconductor device according to claim 1 further characterized in that the base metal layer portion of the J-shaped lead comprises a core layer of a springy metal material of relatively high electrical conductivity having said layer of metal of relatively low solder wettability metallurgically bonded to one side of the core layer on the inner surface of the J-shaped lead and has an additional layer of metal of a relatively higher solder wettability material metallurgically bonded to an opposite side of the core layer material on the outer surface of the J-shaped lead.

3. A semiconductor device according to claim 2 further characterized in that said additional metal layer is bonded to the core layer material along only the curved outer surface of the second leg of the J-shaped lead.

4. A semiconductor device according to claim 2 further characterized in that the core layer comprises a copper-based metal alloy having a nominal composition by weight of 99.75% minimum copper (including silver), 0.04% to 0.08% phosphorus, and 0.1% to 0.12 magnesium, the layer of metal of relatively lower solder wettability comprises an aluminum bronze alloy selected from the group consisting of alloys having a nominal composition by weight of 92.7% copper, 0.2% to 0.5% tin, 6% to 8% aluminum, 0.5% (max.) manganese, and 0.5% (max.) nickel and 91% copper, 1.5% to 3.5% iron, 0.2% (max.) zinc, 6% to 8% aluminum, 1% (max.) manganese, and 0.015% (max.) phosphorus, and the additional metal layer comprises a layer of commercially pure nickel metal material, the device having a plurality of said leads arranged in groups in spaced electrically insulated relation to each other in at least two rows extending along the device body.

5. A surface mounted system for leaded semiconductor devices comprising a printed circuit board having an electrically conducting printed circuit formed on an electrically insulating substrate, and a semiconductor device having a semiconductor element mounted on an electrically insulating body and at least one J-shaped lead electrically connected to the element and extending from the body so that a first leads leg depends from the body and a second lead leg extends from the distal end of the first leg, the second leg having a curved configuration with a convexly curved outer leg surface, the curved outer surfaces of the device leads being soldered to respective portions of the printed circuit on the printed circuit board for electrically connecting the device leads to the printed circuit and for surface mounting the device on the printed circuit board, characterized in that the second leg of each lead has a curved inner surface and the leads each comprise a composite metal laminate material having a base metal layer portion embodying a springy metal material of selected electrical conductivity having a layer of metal of relatively lower solder wettability metallurgically bonded to the base metal layer portion disposed on the curved inner surface of the J-shaped lead to avoid drawing up of solder onto the curved inner surface of the second lead leg when the leads are soldered to the printed circuit so that the curved outer surfaces of the device lead tend to receive and retain solder used in such connection between the curved outer lead leg surfaces and selected portions of the printed circuit for securely electrically connecting the leads to the printed circuit and securely mounting the device on the printed circuit board.

6. A system according to claim 5 further characterized in that the semiconductor device has a plurality of said leads arranged in groups in spaced electrically insulated relation to each other in at least two spaced rows extending along the device body, the base metal layer portion of each lead having a copper-based metal alloy comprising a nominal composition by weight of 99.75% (min.) copper (including silver), 0.04% to 0.08% phosphorus, and 0.1% to 0.12% magnesium, the layer of metal of relatively low solder wettability comprises an aluminum bronze alloy selected from the group consisting of an alloy having a nominal composition by weight of 92.7% copper, 0.2% to 0.5% tin, 6% to 8% aluminum, 0.5% (max.) manganese, and 0.5% (max.) nickel, and an alloy having a nominal composition by weight of 91% copper, 1.5% to 3.5% iron, 0.2% (max.) zinc, 6% to 8% aluminum, 1% (max.) manganese, and 0.015% (max.) phosphorus.

7. A method for making a surface mounted system for leaded semiconductor devices comprising the steps of providing a printed circuit board having an electrically conductive printed circuit formed on an electrically insulating substrate, providing a semiconductor device having a semiconductor element mounted on an electrically insulating body and having at least one J-shaped lead electrically connected to the element and extending from the body so that a first lead leg depends from the body and a second lead leg extends from the distal end of the first leg, the second leg having a curved configuration with a convexly curved outer leg surface and a curved inner surface, the lead comprising a composite metal laminate material having a base metal layer portion embodying a springy metal material of selected electrical conductivity and having a layer of metal of relatively lower solder wettability metallurgically bonded to the base metal layer portion disposed on the curved inner surface of the J-shaped lead to avoid drawing up of solder onto the curved inner surface of the second lead leg during any soldering of the lead, disposing the semiconductor device adjacent the printed circuit board so that the curved outer surface of the J-shaped lead is disposed adjacent a selected portion of the printed circuit on the printed circuit board, and disposing melted solder at the location of said printed circuit portion so that the solder tends to be drawn against the curved outer surface of the J-shaped lead to retain the solder between that curved outer lead surface and said selected portion of the printed circuit for electrically connecting the lead to the printed circuit and surface mounting the semiconductor device on the printed circuit board.

* * * * *